United States Patent [19]

Hazani

[11] Patent Number: 5,162,247

[45] Date of Patent: Nov. 10, 1992

[54] PROCESS FOR TRENCH-ISOLATED SELF-ALIGNED SPLIT-GATE EEPROM TRANSISTOR AND MEMORY ARRAY

[76] Inventor: Emanuel Hazani, 1210 Sesame Dr., Sunnyvale, Calif. 94087

[21] Appl. No.: 613,235

[22] Filed: Nov. 14, 1990

Related U.S. Application Data

[62] Division of Ser. No. 326,924, Mar. 22, 1989, Pat. No. 5,040,036.

[51] Int. Cl.$^5$ .................. H01L 21/265; H01L 21/465
[52] U.S. Cl. ........................................ 437/43; 437/48
[58] Field of Search ............ 437/43, 52, 203, 42, 437/38, 192; 357/23.5, 23.4, 23.6, 41; 156/643; 148/DIG. 109; 365/185

[56] References Cited

U.S. PATENT DOCUMENTS

| | | | |
|---|---|---|---|
| 4,119,995 | 11/1982 | Simko | 357/23.9 |
| 4,122,544 | 10/1978 | McElroy | 365/185 |
| 4,561,004 | 12/1985 | Kuo et al. | 357/23.5 |
| 4,616,245 | 10/1986 | Topich et al. | 357/23.5 |
| 4,639,893 | 1/1987 | Eitan | 365/185 |
| 4,734,384 | 3/1988 | Tsuchiya | 437/38 |
| 4,735,919 | 4/1988 | Faraone | 357/23.5 |
| 4,763,177 | 8/1988 | Paterson | 357/23.5 |
| 4,768,080 | 8/1988 | Sato | 357/23.5 |
| 4,845,544 | 6/1989 | Shimizu | 357/23.6 |
| 4,878,101 | 10/1989 | Hsieh et al. | 365/185 |
| 4,924,437 | 5/1990 | Paterson et al. | 365/185 |

FOREIGN PATENT DOCUMENTS

| | | | |
|---|---|---|---|
| 0253014 | 7/1986 | European Pat. Off. | 357/23.5 |
| 0282023 | 9/1988 | European Pat. Off. | 365/185 |
| 0226966 | 9/1988 | Japan | 365/185 |

*Primary Examiner*—Olik Chaudhuri
*Assistant Examiner*—Loc Q. Trinh

[57] ABSTRACT

A process for the fabrication of an EEPROM structure requiring only two poly layers that utilize hot electrons from the substrate for programming and poly-to-poly electron tunneling for erasure. The structure is advantageously utilized in an Ultra Violate Light Erasable PROM.

The process results in a structure that allows programming and erasure by electron tunneling only.

10 Claims, 5 Drawing Sheets

PROCESS FOR TRENCH-ISOLATED SELF-ALIGNED SPLIT-GATE EEPROM TRANSISTOR AND MEMORY ARRAY

This application is a division of application Ser. No. 07/326,924, now U.S. Pat. No. 5,040,036 issued to the applicant of the present application, filed Mar. 22, 1989.

BACKGROUND OF THE INVENTION

The present invention relates generally to nonvolatile semiconductor memory (ROM) and, more particularly, relates to an improved electrically erasable programmable read only memory (EEPROM).

DESCRIPTION OF THE RELEVANT ART

The invention of U.S. Pat. No. 4,845,538 to E. Hazani uses electron tunneling between two polysilicon layers to perform programming and erasure. U.S. Pat. No. 4,763,299 to E. Hazani describes an invention that uses hot electron from the substrate to program and poly-to-poly electron tunneling to erase.

This invention describes an improved process to build embodiments of U.S. Pat. No. 4,845,538, and U.S. patent application Ser. No. 07/327,663, now U.S. Pat. No. 5,047,814 issued to the applicant of the present application filed Mar. 22, 1989.

It also improves on Ultra Violet Light Erasable PROM (UVEPROM) memory cells using split-gate structures which were disclosed in an article by Barnes, et al. entitled "Operation and Characterization of N-channel EPROM Cells", published in Solid State Electronics, Vol. 21, pages 521–529 (1989) and in an article by Guterman, et al. entitled "An Electrically Alterable Nonvolatile Memory Cell Using a Floating-Gate Structure", published in the IEEE Journal of Solid State Circuits, Vol. SC-14, No. 2, April 1979.

More techniques for fabricating a split-gate EPROM are disclosed in U.S. Pat. No. 4,328,565 issued May 4, 1982 to Harari, and in U.S. Pat. No. 4,639,893 issued Jan. 27, 1987 assigned to Waferscale Integration, Fremont Calif. However these patents still leave room for major improvement in the electrical operation of the cell and in reduction in cell size when similar photolithography equipment is used in fabrication.

SUMMARY OF THE INVENTION

One aspect of the invention discloses an operation as an EEPROM with a memory cell size smaller than the cell disclosed in U.S. Pat. No. 4,845,538, however it requires higher programming voltage.

Another embodiment of the present split-gate invention pertaining to UVEPROM (hot electron programming) will improve on the previous art by providing a smaller cell size if the same minimum critical-dimension of photo lithography equipment are used in fabrication of the cell. Also it provides better control of the channel length dimension of the floating gate. It provides a better control over the coupling overlap-area between the drain diffusion and the floating gate in order to minimize this coupling. It provides a better isolation technique between word-lines and between floating-gates in the array so that significant cell-area reduction is achieved. Further improvement on the previous art is in the reduced possibility of punchthrough due to shallower source and drain N+ junctions.

DETAILED DESCRIPTION OF THE INVENTION

Figure 1:
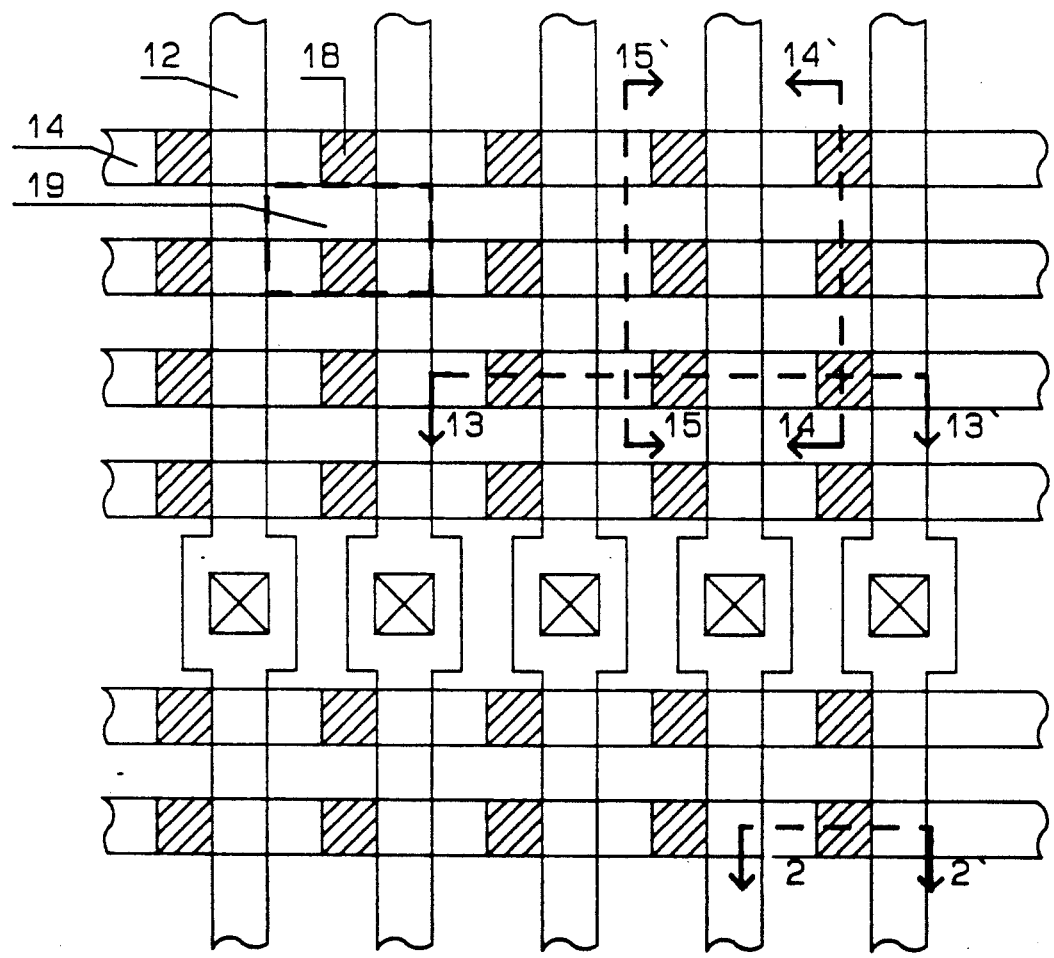
FIG. 1 is a plan view of a portion of a memory chip containing an array of the first embodiment of the present invention.

FIG. 1 depicts the overall layout of the array of EEPROM cells. Referring now to FIG. 1, the array is laid out on the major surface 10 of a p doped monocrystalline silicon substrate. A first set of equispaced, vertical N+ regions 12 form the source/drain lines of the array. These source/drain lines are crossed by a first set of equispaced, horizontal polysilicon word lines 14. A second set of floating gate poly layers 18 each include a first region disposed below an associated word line 14.

The word lines 14 and floating gates 18 are formed from separate poly layers that are deposited over the substrate and then selectively etched. Because the floating gates 18 are disposed below the word line 14, the layer utilized to form the floating gate is deposited first and the floating gates are referred to as poly 1 or P1. Similarly, the word lines are often referred to as poly 2 or P2. This terminology is utilized herein. A basic memory cell 19 is defined at the intersection of each source/drain line 12 and word line 14. The structure of a cell will now be described with reference to FIGS. 2 to 15.

Figure 2:
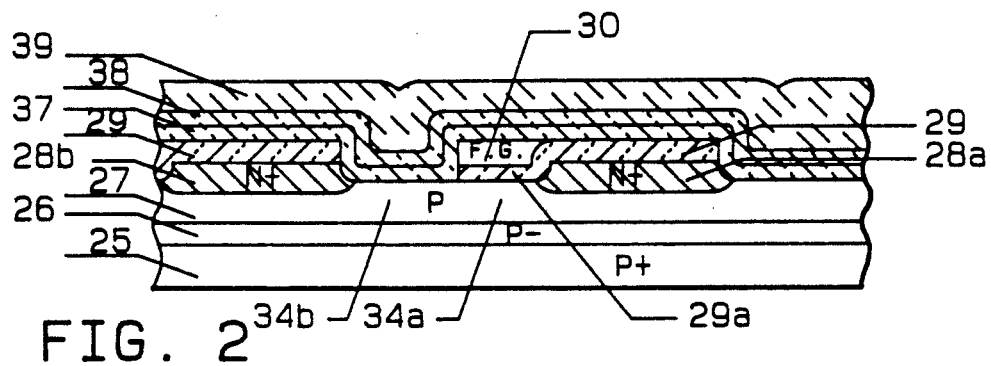
FIG. 2 is a cross section view of one of the memory cells of FIG. 1 along line 2—2' of FIG. 1.

FIG. 2 illustrates a cross-sectional view of a memory cell taken along cut 2—2' of FIG. 1. The cell includes a p+ substrate 25 with a p— epilayer 26. A p well 27 is formed over the p— epilayer 26. Two n+ diffused regions 28a and 28b are spaced apart by a trench. An oxide layer 29 covers regions 28a and 28b. The drain area 34a of the trench is filled with an oxide layer 29a and a polycrystalline silicone layer 30. The source area 34b of the trench is covered by an oxide layer 37 and an oxide layer 38 and polycrystalline silicone layer 39. Oxide layer 29 is greater in thickness over the n+ diffused regions 28a and 28b than the thickness of oxide layer 29a over the drain area 34a of the trench. Oxide layers 37 and 38 isolate the polycrystalline region 30 and the polycrystalline layer 39 which covers the upper surface of oxide layer 38 over the source area 34b of the trench and also covers the upper surface of oxide layer 38 over the polycrystalline region 30.

The channel region of the cell is created between the n+ regions 28a and 28b. The n+ regions 28a and 28b form the drain and the source of the transistor respectively. A floating gate is formed by the polycrystalline silicone region 30 over the drain area 34a of the channel. The control gate is formed by the polycrystalline silicone 39 over the source area of the channel 34b and over the floating gate 30.

It was disclosed in U.S. Pat. No. 4,845,538 and in accompanying application Ser. No. 07/327,663, now U.S. Pat. No. 5,047,814 issued to the applicant of the present application, filed Mar. 22, 1989 that the cell may be programmed by holding the drain at a high voltage Vpp while the control gate is held at Vss ground potential. The source may be held at Vss or at half Vpp ($\frac{1}{2}$*Vpp). This biasing condition ensures that the source area of the channel 34b is not inverted and that there is no current between drain and source. At this voltage conditions the drain voltage is coupled to the floating gate through the capacitance of the overlap area between floating gate 30 and drain diffusion 28a. The floating gate voltage increases to such a level which is higher than the unprogrammed threshold voltage of the cell, thus inverting the drain area of the channel 34a. Once the drain area 34a is inverted it carries the high voltage Vpp of the drain 28a. The capacitive coupling between the drain area 34a and the floating gate is about 5 to 10 times that of the capacitive coupling between the drain 28a and the floating gate.

This sudden increase of Vpp coupling to the floating gate through the drain area 34a brings the floating gate to a voltage which causes reverse electron tunneling from the grounded control gate 39 to the floating gate 30, through the oxide layers 38 and 37. This transfer of electrons which are trapped in the floating gate programs the cell by changing its threshold. The cell may be erased by holding the drain 28a and source 28b at Vss and taking the control gate 39 to high voltage Vpp. This causes forward electron tunneling from the floating gate to the control gate through oxide layers 37 and 38, which brings the cell to an unprogrammed threshold voltage.

Another method of programming the cell may be as a split-gate EPROM. As known the EPROM cell will program when the control gate 39 is at high voltage Vpp, the drain voltage is at high voltage close to Vpp and the source voltage is at Vss ground voltage. This bias condition causes high current flow between drain and source diffusions, which in turn causes electron injection from the substrate into the floating gate through oxide layer 29a. These increase in number of electrons trapped in the floating gate increases the threshold of the cell significantly; thus, it is programmed.

Erasure of the cell may be done electrically by holding the drain and source diffusions at Vss ground potential and taking the control gate to Vpp high voltage. This will cause foreword electron tunneling from the floating gate 30 to control gate 39, thus bring the cell to its initial threshold voltage. Another method of erasure may be by exposing the array to ultraviolet light, a common procedure in the EPROM business.

Another method of erasure when the cell is programmed by hot electrons is by taking the word-line polysilicon control gate to a negative voltage of −16 volts, while grounding the drain and source bit-lines at 0 volts. This will erase all the cells along a selected word lines, because electrons will leave floating gates in these cells due to the rejecting force from the negatively charged word line.

Another method of erasure when the cell is programmed by hot electrons is by tunneling electrons from the floating gate to the drain diffusion through the sidewall oxide which is placed between oxide layer 29 on the drain and oxide layer 29a in FIG. 2. This is done by making the sidewall oxide about 100 Angstrom thin. Erasure in this method takes place when a selected cell's word line is grounded at 0 volt and its drain is taken to about 12 volts.

Another method of programming and erasing the cell is through the thin tunneling sidewall oxide, which was described above, between the floating gate and the drain diffusion. In this method programming takes place when a selected word line is taken to about 15 volts and all source and drain bit-lines are grounded to prevent hot electron programming. Due to voltage coupling from control-gate word-line to the floating gate, electrons will travel from drain diffusion to floating gate and program the cell. Erasure in this method occurs when a selected cell's drain bit-line is taken to 5 volts while its word line is taken to negative voltage of −11 volts, which causes electrons to transfer from the floating gate to the positively biased drain.

Figure 3:
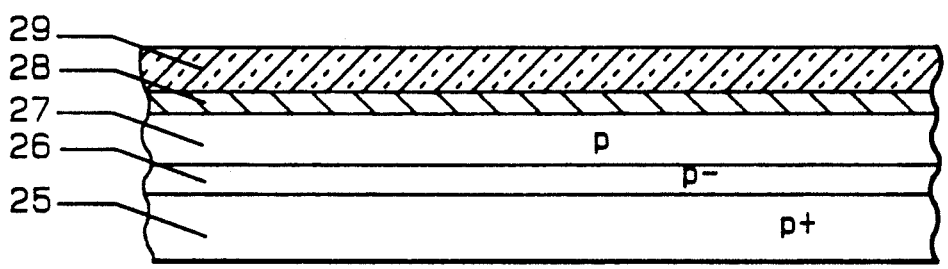
FIG. 3 is a cross section illustrating an initial stage of manufacturing of the device of FIG. 2.

Referring to FIG. 3, it illustrates a cross sectional view of the initial fabrication steps, which are commonly used in the art. A p+ doped substrate 25 is a starting material on which a p− epitaxial layer 26 is grown to a thickness of about 15 microns which will have a low resistence of about 10 ohm/cm3. A p well 27 is then implanted using 10E12/cm3 boron for 1800 minutes at 1150 deg. C. to form a 3.5 micron thick layer 27. An n+ Arsenic ions 1.0E16/cm2 are then implanted at 60 KeV and annealed at 850 deg. C. for 120 minutes, thus layer 28 is formed. An oxide layer 29 is then grown to a thickness of 1000 Angstroms at 800 deg. C.

Figure 4:
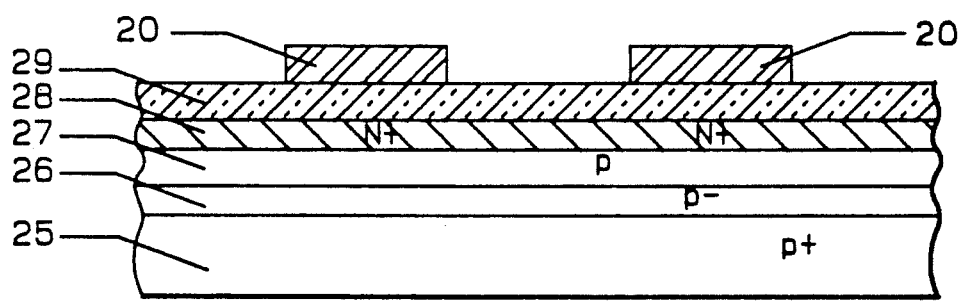
FIGS. 4 and 5 illustrate steps in formation of the diffusion bit-lines.

FIG. 4 illustrates a resist 20 patterned in the form of the bit line mask over the oxide 29.

Figure 5:
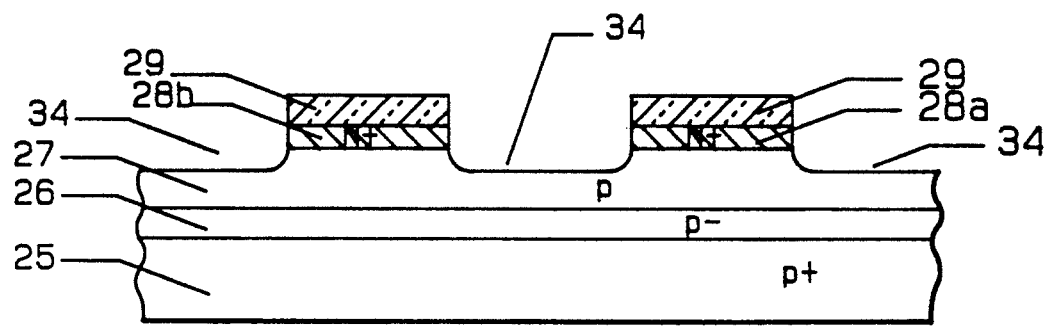

FIG. 5 shows the result of etching the areas of oxide 29 and n+ diffusion 28 not protected by resist 20. The etching step continues until a trench 34 is formed in the p well 27. In an array, the trenches are separated by the n+ areas 28 which form the column bit lines. After removal of the resist, the structure of FIG. 5 will consist of n+ regions 28a and 28b about 600 Angstrom thick, oxide regions 29 about 1000 Angstrom thick and trenches 34 about 2500 Angstrom deep.

Figure 6:
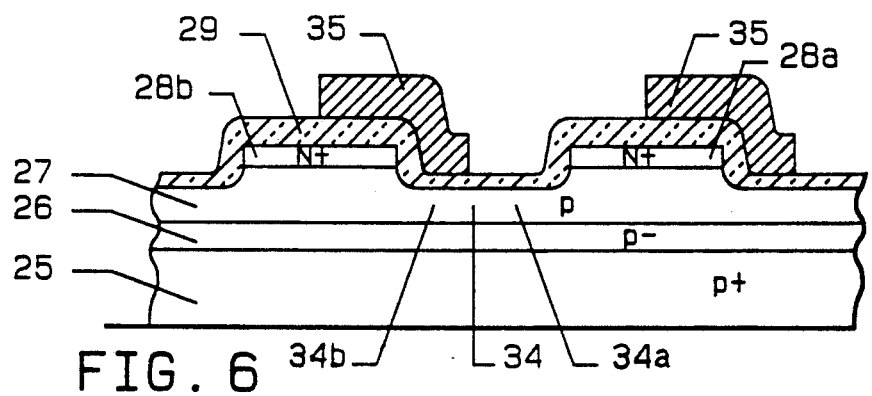
FIG. 6 illustrates the use of nitride to define the drain area of the channel, which will be covered by the floating-gate.

FIG. 6 illustrates that 250 Angstrom thermal oxide is grown over the trench area after a threshold voltage implant was implanted to set it at about 0.8 V. A special mask is used to pattern a deposited nitride film 35, such that it is aligned to the center of the n+ diffusion bit line layer 28b. The nitride film 35 covers half of source region 28b and the portion of the trench which will be covered by the control gate and will define the source area 34b. The definition of the source area is done within one alignment tolerance of the photolithography equipment used in fabrication.

Figure 7:
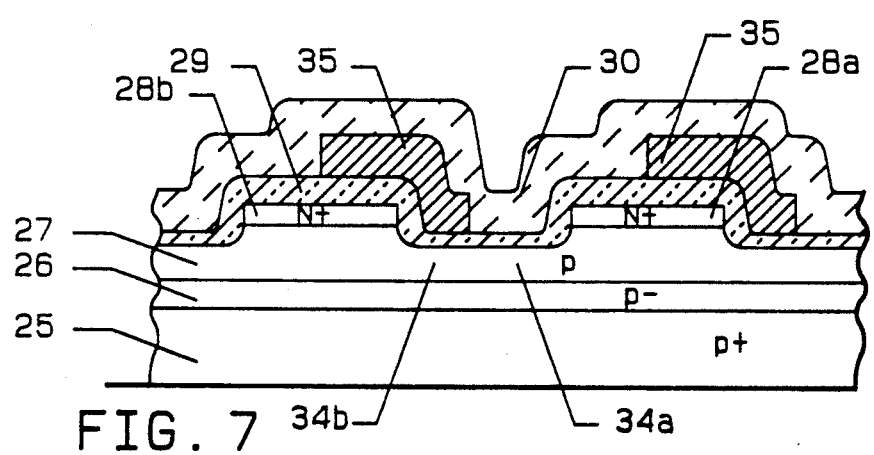
FIGS. 7 and 8 illustrate steps in formation of the floating gate.
Figure 8:
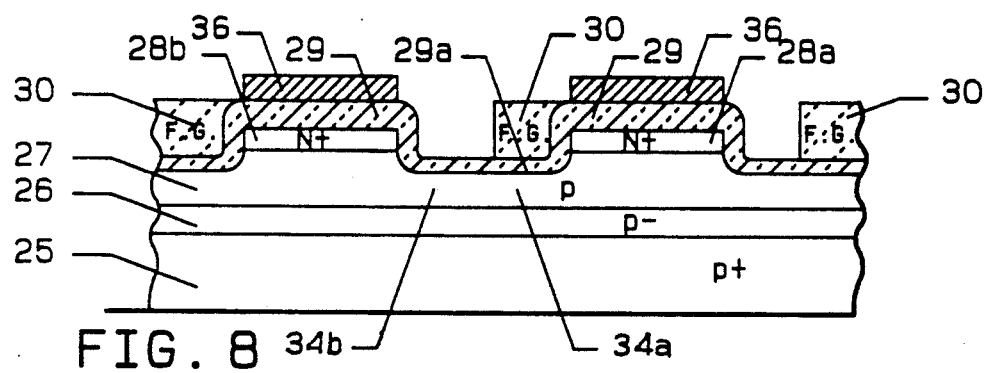

Using nitride film 35 to protect the source area 34b of the channel, polysilicon layer 30 is then deposited as illustrated in FIG. 7 for example at 650 degrees C. by low pressure chemical vapor deposition (LPCVD). The polysilicon layer 30 is then doped with phosphorous by passing POCL3 through a chamber at 950 degrees C. for about 15 minutes. An etching of poly-1 is performed using plasma or reactive ion etching to a point where poly-1 covers only the drain area 34a and is removed from all other areas. The nitride film 35 is then removed by chemical stripping and the result is illustrated in FIG. 8.

In one example the floating gate poly-1 30 covers half the trench so that the drain area 34a is about as wide as half the channel. The thickness of the floating gate poly-1 30 at this step of processing is about 3500 Angstrom.

Figure 9:
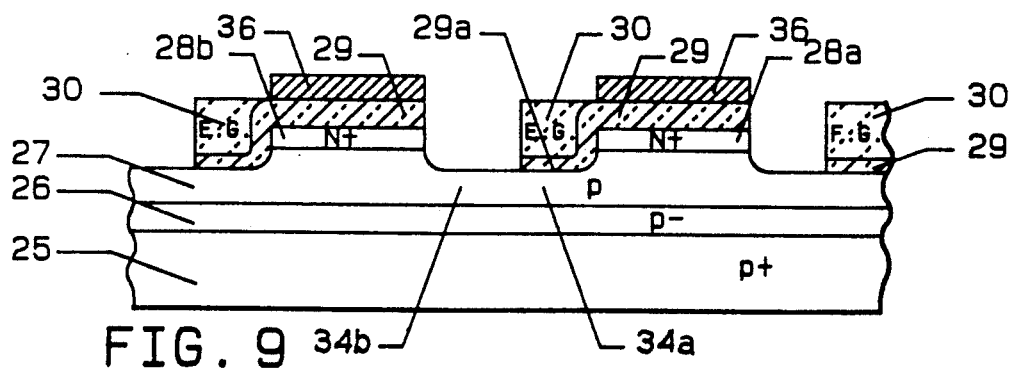
FIGS. 9 and 10 illustrate steps in formation of the interpoly-oxide, and the control-gate (word-line).
Figure 10:
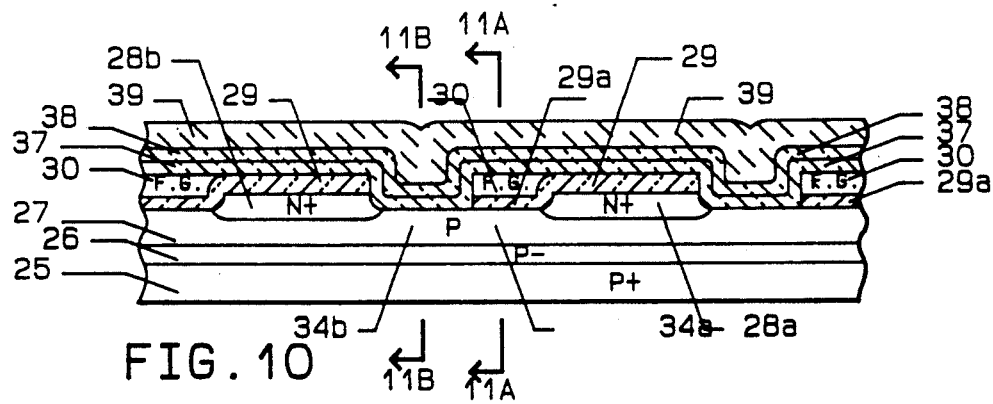

In preparation to forming the interpoly dielectric, a resist 36 is formed over the bit-line oxide 29 to protect it from an etchant that is used to etch oxide 29b over the source area 34b. The resist is defined using the same mask which was used to define the bit-line n+ areas 28. The etchant used here etches oxide much faster then polysilicon, such that floating gate 30 remains in tact. The result of the removal of oxide 29b is illustrated in FIG. 9. This was done in order to keep the gate oxide thickness along the channel 34 about the same even after deposition of the second polysilicon layer 39, which is shown in FIG. 10.

After the removal of oxide 29a and resist 36, the floating gate 30's surface is oxidized in an atmosphere of oxygen and steam at 800 degree C. such that mainly the top surface of layer 30 at the interface with this thermal oxide (not shown) is textured with asperites. After a period of time of oxidation which gives a desired asperity size, the oxide is removed, and the floating gate 30 is covered with apserities, the source area 34b is not covered with oxide. A new thermal oxide 37 is then grown over floating gate 30, source area 34b and the whole array, in a mixture of oxygen and steam at 800 degree C. to a thickness of about 150 Angstroms. Another layer of TEOS (tetraethylorthosilane) based LPCVD oxide layer 38 is deposited to a thickness of about 300 Angstrom over thermal oxide 37, as shown in FIG. 10. This combination of thermal oxide and deposited oxide dielectric was shown to increase the oxide breakdown voltage and reduce electron trapping in the oxide, which is advantageous in EEPROM memory chips. Although, a combination of thermal oxide and deposited oxide was chosen in this embodiment, thermal oxide alone or deposited oxide alone will be sufficient to function as the interpoly dielectric.

After oxide layer 38 was deposited, its top surface topography will follow the shape of the textured top surface of the floating gate 30, however in a much more moderate undulations due to the oxide deposition process.

The thickness of the oxides on poly-1 layer 30 is 450 Angstrom, so is the thickness of the oxides on top of source area 34b. The thickness of the oxide on the bit-line regions 28 is about 1500 Angstroms. Due to the thermal cycles used in this fabrication process, the depth of the bit-line n+ regions 28a and 28b into the substrate will increase, but will remain small in relation to the transistors channel since the depth of trench 24 is subtracted from the depth of n+ regions 28.

At this stage a second polysilicon layer 39, illustrated in FIG. 10 is deposited on oxide layer 38 by LPCVD at 650 degree C. to a thickness of about 4000 Angstrom and then doped with phosphorous by passing POCL3 through a chamber at 950 degree C. for about 15 minutes.

The bottom side of the polysilicon layer 39, also called poly-2, will take the shape of the mild undulations on the top surface of LPCVD oxide layer 38, such that a convex asperity on top of poly-1 layer 30 will face a concave layer of polysilicon at the bottom side of poly-2 layer 39.

As is well known in the art the tunneling threshold voltage of electrons tunneling through oxide dielectric from convex polysilicon to concave polysilicon, also called forward tunneling threshold voltage VXF, is lower then the reverse tunneling threshold voltage VXR. The tunneling voltage of electrons tunneling through oxide dielectric from concave polysilicon to a convex polysilicon, also called reverse tunneling threshold voltage VXR is higher then the forward tunneling threshold voltage VXF.

This asymmetry of tunneling between two polysilicon layers is applied in the operation of the cell. Where reverse tunneling from poly-2 layer 39 to poly-1 floating gate layer 30 is used for programming and forward tunneling from poly-1 floating gate layer 30 to poly-2 layer 39 is used for erasure.

Figure 11B:
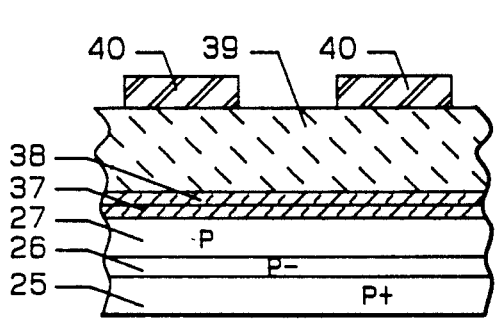
FIGS. 11A and 11B are section-cuts along lines 12A and 12B of FIG. 10 after application of resists in the fabrication of the device.
Figure 11A:
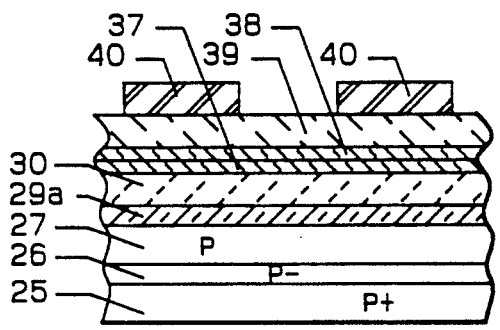

FIG. 11A and FIG. 11B illustrate sectional cuts along lines 11A and 11B of FIG. 10 respectively, in parallel to the bit-line axis. The resist layer 40 defines the word-lines 14 of FIG.-1. The structure of FIG. 11A and FIG. 11B is etched to define the word-line and the floating-gate. The etch process etches through polysilicon layer 39, the interpoly LPCVD oxide layer 38, inter-poly thermal oxide layer 37 and polysilicon layer 30. The etch does not pass through oxide layers 38 and 37 along section cut 11B, or oxide layer 29a along section cut 11A.

Figure 12B:
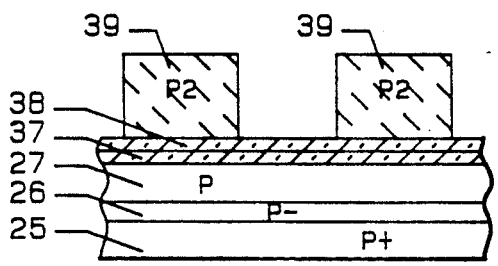
FIGS. 12A and 12B are section-cuts along lines 12A and 12B of FIG. 10 after an etching step.
Figure 12A:
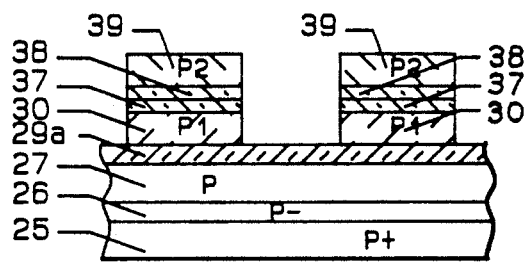

FIG. 12A and FIG. 12B illustrate the resultant structure of FIG. 11A and FIG. 11B after the etching to form the word lines 14 of FIG. 1.

Figure 13:
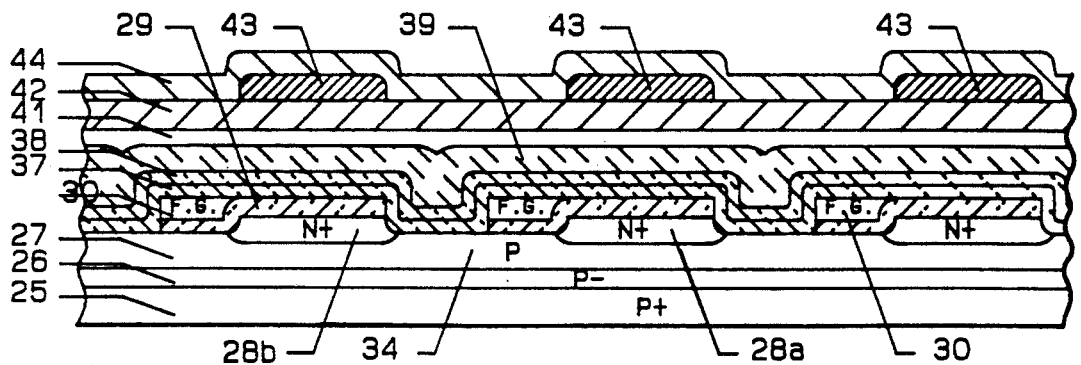
FIG. 13 is a cross section along line 13—13' of FIG. 1 illustrating a later fabrication stage which includes the metal bit-lines.

FIG. 13 illustrates a sectional view similar to that shown in FIG. 10 after the addition of subsequent layers. An LPCVD TEOS based pad oxide layer 41 is deposited and is covered with a layer 42 of phosphorous-doped field oxide. Metal layers 43, for example of aluminum are then formed and patterned to form the column bit-lines. Each metal bit-line connects to a separate n+ bit-line 28 every several word-lines, through a contact opening in the field oxide. This is done in order to shunt the n+ higher resistance in order to prevent an undesired voltage drop between a selected cell and ground or the path between the selected cell and the sense-amplifier.

The metal lines of layer 43 are then covered with protective oxide coating 44 formed of 4% phosphorous-doped silicon dioxide.

Figure 14:
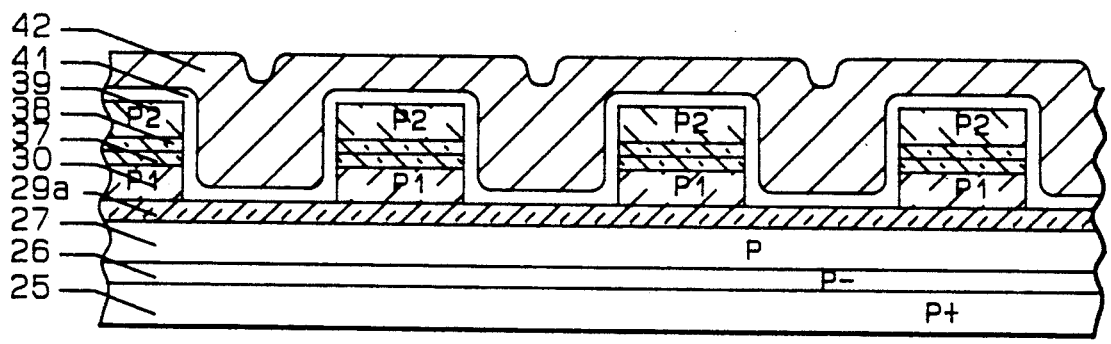
FIG. 14 is a cross section along line 14—14' of FIG. 1 illustrating a later fabrication stage which includes word-line to word-line isolation near the floating gates.
Figure 15:
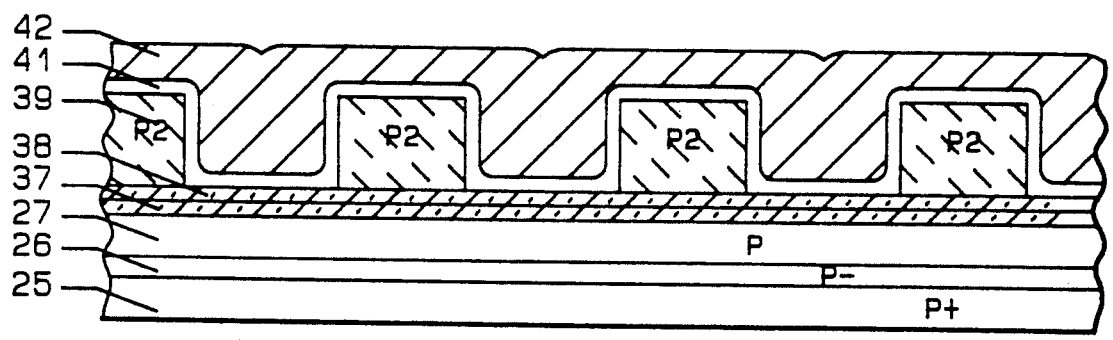
FIG. 15 is a cross section along line 15—15' of FIG. 1 illustrating a later fabrication stage which includes word-line to word-line isolation where there are no floating gates.

FIG. 14 and FIG. 15 illustrate sectional views taken generally along the section lines 14-14' and 15-15' of FIG. 1. FIG. 14 and FIG. 15 are similar to FIG. 12A and 12B, with the addition of the pad LPCVD TEOS based oxide layer 41 and the phosphorous-doped silicon oxide layer 42.

As will now be apparent, the present invention provides the following substantial advantages over previously developed split-gate transistors containing a floating gate.

1) Unlike prior art devices the "electrical channel width" of the transistor is not reduced from the "drawn width" of the cell due to encroachment of the field oxide during isolation. Rather the channel width is defined by the word-line's polysilicon width and the trench 34, which is also the distance between n+ regions 28a and 28b. This provides higher cell current per drawn trnsistor width.

2) The absence of the "end-cap" of the floating-gate over the field oxide, reduces the spacing between word lines, thus significantly increases the density of memory arrays.

3) The alignment and fabrication process reduce the minimum split-gate transistor size, such that the drawn channel length between source and drain diffusion is the minimum critical dimension of the photolithography equipment used in manufacturing. And is not limited, as is the case in prior art, by the fact that two polysilicon layers, which are isolated from each other lay next to each other on the same channel, thus dictate the channel length.

4) Reduced punchthrough of the channel due to shalower n+ junctions in the bit-line areas. For example n+ junction depth for EEPROM embodiment, not using hot-electrons programming, is 0.15 micrometers, and 0.2 micrometers for UVEPROM embodiment. These values are lower then junctions needed for prior art split-gate devices.

5) Junction breakdown voltage is higher due to shalower bit-line n+ junctions.

6) In EEPROM embodiments using polysilicon to polysilicon electron tunneling for programming and erasure, there is no current flowing through the bit-line diffusions. And since the largest amount of current through the bit-lines of about 200 uA flows during the read operation, and is relatively low, the voltage drop across the n+ diffusion bit-line resistance will be small. Thus the width of the bit-line width can be narrow which further reduces the cell size and increases array density.

7) The transistor's EEPROM embodiment, which is not using hot electron programming or thin tunneling oxide, may be used in logic circuits as a regular NMOS transistor. This is because it does not suffer from the "soft-write" phenomenon typical to hot electron programmed transistors.

8) In the EEPROM transistor using poly-to-poly electron tunneling for programming and erasure, materials other then silicon may be used to fabricate this Field Effect Transistors. For example the substrate layers 25, 26, 27 may be of GaAs or Germanium, thereby increasing the transistor current by about threefold. This improves read access time in memory chips, and reduces delay in programmable-logic chips.

Preferred embodiments of the invention have now been described. Various substitutions and alterations to these embodiments will be apparent to persons of skill in the art apprised by the teaching of this patent. It is therefore not intended that the invention be limited to the described embodiments, but that invention be defined by the appended claims.

What is claimed is:

1. A method of manufacturing a split-gate memory transistor containing a floating gate comprising:
   implanting impurities layer of a first conductivity type onto semiconductor substrate of a second conductivity type;
   forming a first insulator layer on said impurities layer;
   forming a first photoresist layer over said first insulator, forming a first opening in said first photoresist pattern to expose a channel area;
   etching through said first insulator layer, said impurities layer and through portion of said substrate to form a trenched channel area having a drain impurities region extending laterally away from a first edge of said trenched channel area and a source impurities region extending laterally away from a second edge of said trenched channel area, said impurities regions separated laterally from each other;
   removing said first photoresist;
   forming a second insulator layer over the entire structure;
   forming a nitride film over said substrate and over said second insulator, a first opening being formed in said nitride film to expose both a drain area of said trenched channel area and a first portion of said second insulator covering said drain impurities region of said transistor;
   forming a first polysilicon layer over the entire structure and etching said first polysilicon layer so as to remove it from all areas except over said drain area of said trenched channel to form a floating gate;
   removing said nitride film to expose a surface of said second insulator over a source area of said trenched channel area and to expose the surface of said second insulator over said source region, said source area extends laterally between said drain area and said source region;
   forming a second photoresist layer over said second insulator to overlap said drain and source regions;
   etching said second insulator over said source area to expose said source area;
   removing said second photoresist;
   forming a third insulator layer over the entire structure; and
   forming a second polysilicon layer control gate over said third insulator to insulate said source area and said floating gate from said control gate.

2. The method of claim 1 wherein said floating gate has a selected edge self-aligned to said drain region of said transistor.

3. The method of claim 1 wherein the first opening in the nitride film is patterned to expose a laterally extending insulator surface covering portion of said drain region that is extending from the first edge of said trenched channel, to a point near the middle of said drain region.

4. The method of claim 1 wherein said first polysilicon is etched to form said floating gate having an upper surface with higher elevation than the elevation of the upper surface of said drain region and so that the bottom surface of said floating gate has lower than the upper surface of said drain region.

5. A method of forming an array of self aligned nonvolatile programmable memory cells having N horizontal rows and M vertical columns on a semiconductor substrate comprising:
   (a) forming a first plurality of conductive continuous elongated parallel strips of impurities regions within said substrate so that said impurities strips are oriented vertically;
   (b) forming a second plurality of continuous elongated parallel strips of conductive material that are insulatively disposed over said substrate and are oriented vertically, said second strips being self-aligned to corresponding defining edges of said first elongated parallel strips of conductive material; and (c) forming at least one gap in each of said second continuous strips thereby forming electrically isolated floating gates from said second continuous elongated strips of conductive material.

6. The method of claim 5 wherein step (c) comprises the following steps:
   (a) forming a film of continuous conductive material on said substrate and over said second conductive strips in a manner to be insulated therefrom by a second dielectric layer; and
   (b) forming at least one gap through said film of conductive material and through each of said second continuous elongated parallel strips of conductive material of control gates and word lines that are oriented horizontally, and said gap also forming electrically isolated floating gates from said second continuous elongated strips of conductive material.

7. The method of claim 5 further including the step of texturing the surface of said floating gates.

8. The method of claim 5 wherein said substrate is of a first conductivity type said impurities regions of a second conductivity type and said impurities regions forming source and drain regions of MOS field effect memory transistors and said impurities regions also forming bit line regions; and
   said floating gates are disposed over a portion of a corresponding channel region of said transistors.

9. The method of claim 5 wherein said impurities region are diffused to form overlap regions wherein said floating gates partially overlap said associated impurities regions by a diffusion determined distance.

10. The method of claim 5 wherein each of said floating gates having a surface that is not facing said substrate and wherein substantially all said surface absorbed the same quantity of said impurities.

* * * * *